United States Patent
Huang (10) Patent No.: US 9,847,303 B2
(45) Date of Patent: Dec. 19, 2017

(54) ELECTROSTATIC DISCHARGE PROTECTION CHIP AND DRIVING CIRCUIT

(71) Applicant: SHENZHEN CHINA STAR OPTOELECTRONICS TECHNOLOGY CO., LTD., Shenzhen, Guangdong (CN)

(72) Inventor: Xiaoyu Huang, Shenzhen (CN)

(73) Assignee: SHENZHEN CHINA STAR OPTOELECTRONICS TECHNOLOGY CO., LTD., Shenzen, Guangdong (CN)

( * ) Notice: Subject to any disclaimer, the term of this patent is extended or adjusted under 35 U.S.C. 154(b) by 451 days.

(21) Appl. No.: 14/405,808

(22) PCT Filed: Jul. 17, 2014

(86) PCT No.: PCT/CN2014/082370
§ 371 (c)(1),
(2) Date: Dec. 5, 2014

(87) PCT Pub. No.: WO2015/180246
PCT Pub. Date: Dec. 3, 2015

(65) Prior Publication Data
US 2016/0259220 A1   Sep. 8, 2016

(30) Foreign Application Priority Data
May 28, 2014   (CN) .......................... 2014 1 0230571

(51) Int. Cl.
*H01L 23/60* (2006.01)
*G02F 1/13* (2006.01)
(Continued)

(52) U.S. Cl.
CPC ............ *H01L 23/60* (2013.01); *G02F 1/1309* (2013.01); *G02F 1/136204* (2013.01);
(Continued)

(58) Field of Classification Search
CPC ........... G02F 1/136204; G02F 2201/50; G02F 1/1309; G09G 3/36; G09G 2330/04;
(Continued)

(56) References Cited

U.S. PATENT DOCUMENTS

2005/0007711 A1* 1/2005 Liu .................. H02H 3/202
361/90
2013/0329322 A1* 12/2013 Wang ................ H05B 33/083
361/56

(Continued)

*Primary Examiner* — Liliana Cerullo
(74) *Attorney, Agent, or Firm* — Sughrue Mion, PLLC (57) ABSTRACT

An electrostatic discharge protection chip is provided. The electrostatic discharge protection chip includes an electrostatic discharge module for discharging abnormal static electricity on the driver chip, and at least one detection module for detecting an equivalent resistor of the electrostatic discharge module in the driving circuit to determine whether the electrostatic discharge module is abnormal. The technical problems of the undetectable abnormal condition of the electrostatic discharge module, low functional efficiency, and high production cost are resolved.

13 Claims, 4 Drawing Sheets

(51) Int. Cl.
*H02H 9/04* (2006.01)
*H01L 27/02* (2006.01)
*G09G 3/36* (2006.01)
*G02F 1/1362* (2006.01)

(52) U.S. Cl.
CPC ........... *G02F 2201/50* (2013.01); *G09G 3/36* (2013.01); *G09G 2330/04* (2013.01); *H01L 27/0248* (2013.01); *H02H 9/046* (2013.01)

(58) Field of Classification Search
CPC ..... H01L 23/30; H01L 27/0248; H02H 9/046; H05K 1/0259
USPC .......................................................... 361/56
See application file for complete search history.

(56) References Cited

U.S. PATENT DOCUMENTS

| | | | | |
|---|---|---|---|---|
| 2014/0043040 | A1* | 2/2014 | Deng | G01R 31/046 324/538 |
| 2014/0146426 | A1* | 5/2014 | Murakami | H03K 19/00315 361/56 |

* cited by examiner

ELECTROSTATIC DISCHARGE PROTECTION CHIP AND DRIVING CIRCUIT

FIELD OF THE INVENTION

The present invention relates to the technical field of liquid crystal displays, particularly to an electrostatic discharge protection chip and a driving circuit in a thin-film transistor liquid crystal display.

BACKGROUND OF THE INVENTION

A thin film transistor liquid crystal display (TFT-LCD) is one of the major types of current display panels, and has become an important displaying platform in modern information technology (IT) and visual information products. The main driving principle of TFT-LCDs is that a system motherboard is connected with a connector on a printed circuit board through wires where the compressed signals and the control signals of red/green/blue (R/G/B) and power is transmitted, and the connector is connected with a driving chip, application-specific integrated circuit (ASIC), in the liquid crystal display panel for providing the driving chip with input power and driving signals.

However, in the practical process, since static electricity is produced on the connector during the connecting process, causing damage to the driving chip, ASIC, it is generally necessary to perform electrostatic discharge protection on important signals at the junction between the connector and the driving chip, which connects an electrostatic discharge protection chip between corresponding pins of the driving chip and the connector. The electrostatic discharge protection chip has multiple pins, as well as ground pins (GND) and power supply pins (VDD).

Figure 1:
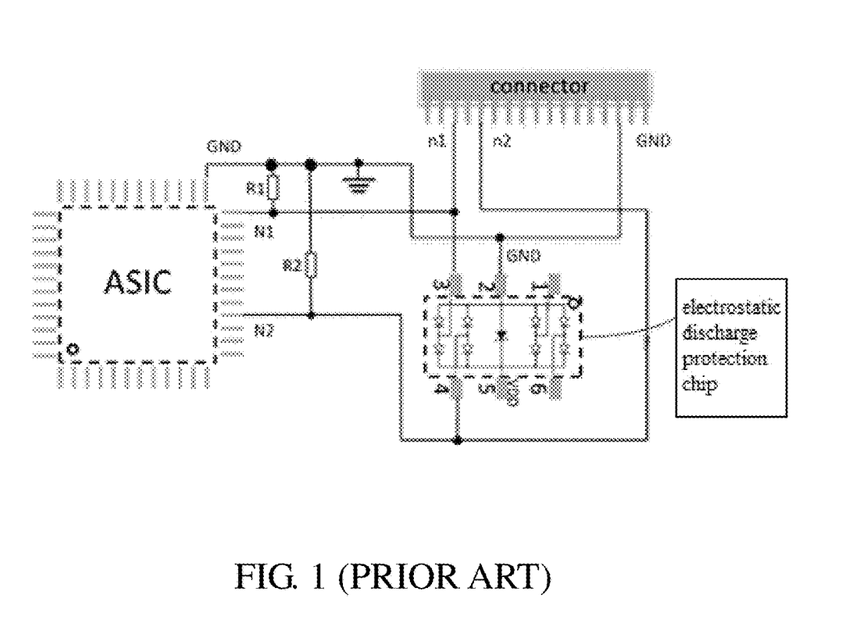
FIG. 1 is a schematic diagram of a connection structure of an electrostatic discharge protection chip in prior art.
Figure 2:
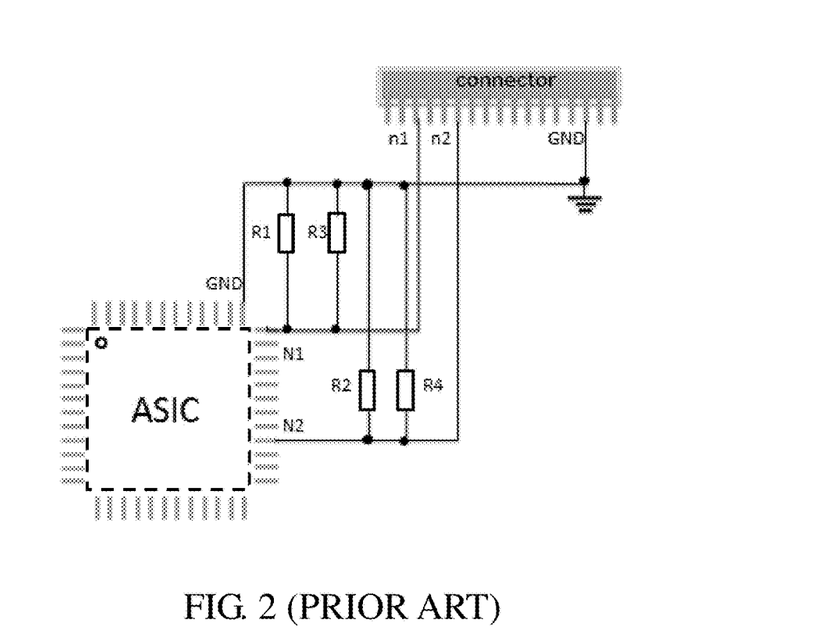
FIG. 2 is a schematic diagram of an equivalent connection structure of an electrostatic discharge protection chip in FIG. 1.

FIG. 1 is a connection structure diagram of an electrostatic discharge protection chip in prior art. When the connection structure of the working electrostatic discharge protection chip is equivalent to the connection structure in FIG. 2, since the electrostatic discharge protection chip is connected between the connector and the driving chip, which is equal to providing multiple equivalent resistors between the connector and the driving chip (for example, R3 and R4), the current inputted on the pins on the driving chip is reduced, thereby protecting the driving chip.

However, the electrostatic discharge protection chip in the prior art can be worn off. When the electrostatic discharge protection chip is worn off, it cannot well protect the driving chip, ASIC. This loss can not be detected in normal shipment inspection. It can only be determined by measuring resistors with an avometer. The efficiency of measurement via an avometer is low, and lengthy training for measuring personnel is required. There is no mass production value.

SUMMARY OF THE INVENTION

A primary object of the present invention is to provide a electrostatic discharge protection chip for resolving the technical problems of the undetectable abnormal condition of the electrostatic discharge module, low functional efficiency, and high production cost are resolved.

To achieve the above object, an electrostatic discharge protection chip in the present invention is disposed in a liquid crystal display device. The liquid crystal display device includes a liquid crystal display panel and a driving circuit for driving the liquid crystal display panel. The driving circuit includes a driving chip and a connector connected with the liquid crystal display panel. The electrostatic discharge protection chip comprises:

an electrostatic discharge module for discharging abnormal static electricity on the driver chip; and at least one detection module for detecting an equivalent resistor of the electrostatic discharge module in the driving circuit to determine whether the electrostatic discharge module is abnormal, the electrostatic discharge protection chip being connected with the driving chip and the connector, respectively, wherein the detection module comprises a DC power source, a first resistor, a second resistor, a reference resistor, and a detection element, an end of the first resistor is connected with a positive electrode of the DC power source, the other end thereof is connected with an end of the equivalent resistor, and the other end of the equivalent resistor is connected with a negative electrode of the DC power source, an end of the second resistor is connected with the positive electrode of the DC power source, the other end of the second resistor is connected with the reference resistor in series, and then connected with the negative electrode of the DC power source, an end of the detection element is connected between the equivalent resistor and the first resistor, the other end of the detection element is connected between the reference resistor and the second resistor, and the detection element determines whether the equivalent resistor is abnormal by detecting a voltage difference between the equivalent resistor and the reference resistor, wherein a ratio of the first resistor to the equivalent resistor is equal to a ratio of the second resistor to the reference resistor, wherein the first resistor is equal to said second resistor,
wherein the reference resistor is a variable resistor.

In the electrostatic discharge protection chip of the present invention, the detection element is a light emitting diode (LED), a negative electrode of the LED is connected between the equivalent resistor and the first resistor, and a positive electrode of the LED is connected between the reference resistor and the second resistor.

In the electrostatic discharge protection chip of the present invention, when the LED emits light, the equivalent resistor is abnormal, and when the LED does not emit light, the equivalent resistor is normal.

An electrostatic discharge protection chip in the present invention is disposed in a liquid crystal display device. The liquid crystal display device includes a liquid crystal display panel and a driving circuit for driving the liquid crystal display panel. The driving circuit includes a driving chip and a connector connected with the liquid crystal display panel. The electrostatic discharge protection chip comprises:

an electrostatic discharge module for discharging abnormal static electricity on the driver chip; and at least one detection module for detecting an equivalent resistor of the electrostatic discharge module in the driving circuit to determine whether the electrostatic discharge module is abnormal;

the electrostatic discharge protection chip being connected with the driving chip and the connector, respectively.

In the electrostatic discharge protection chip of the present invention, the detection module comprises a DC power source, a first resistor, a second resistor, a reference resistor, and a detection element, an end of the first resistor is connected with a positive electrode of the DC power source, the other end thereof is connected with an end of the equivalent resistor, and the other end of the equivalent resistor is connected with a negative electrode of the DC power source, an end of the second resistor is connected with the positive electrode of the DC power source, the other end of the second resistor is connected with the reference resistor in series, and then connected with the negative electrode of the DC power source, an end of the detection element is connected between the equivalent resistor and the first resistor, the other end of the detection element is connected between the reference resistor and the second resistor, and the detection element determines whether the equivalent resistor is abnormal by detecting a voltage difference between the equivalent resistor and the reference resistor, wherein a ratio of the first resistor to the equivalent resistor is equal to a ratio of the second resistor to the reference resistor.

In the electrostatic discharge protection chip of the present invention, the detection element is a light emitting diode (LED), a negative electrode of the LED is connected between the equivalent resistor and the first resistor, and a positive electrode of the LED is connected between the reference resistor and the second resistor.

The electrostatic discharge protection chip as claimed in claim 8, wherein the first resistor is equal to said second resistor.

The electrostatic discharge protection chip as claimed in claim 8, wherein the reference resistor is a variable resistor.

A primary object of the present invention is to provide a diving circuit for resolving the technical problems of the undetectable abnormal condition of the electrostatic discharge module, low functional efficiency, and high production cost are resolved.

To achieve the above object, a driving circuit is constructed in the present invention. The driving circuit comprises a driving chip and a connector connected with the liquid crystal display panel. The driving circuit further comprises an electrostatic discharge protection chip. The electrostatic discharge protection chip comprises:

an electrostatic discharge module for discharging abnormal static electricity on the driver chip; and at least one detection module for detecting an equivalent resistor of the electrostatic discharge module in the driving circuit to determine whether the electrostatic discharge module is abnormal;

the electrostatic discharge protection chip being connected with the driving chip and the connector, respectively.

In the driving circuit of the present invention, the detection module comprises a DC power source, a first resistor, a second resistor, a reference resistor, and a detection element, an end of the first resistor is connected with a positive electrode of the DC power source, the other end thereof is connected with an end of the equivalent resistor, and the other end of the equivalent resistor is connected with a negative electrode of the DC power source, an end of the second resistor is connected with the positive electrode of the DC power source, the other end of the second resistor is connected with the reference resistor in series, and then connected with the negative electrode of the DC power source, an end of the detection element is connected between the equivalent resistor and the first resistor, the other end of the detection element is connected between the reference resistor and the second resistor, and the detection element determines whether the equivalent resistor is abnormal by detecting a voltage difference between the equivalent resistor and the reference resistor, wherein a ratio of the first resistor to the equivalent resistor is equal to a ratio of the second resistor to the reference resistor.

In the electrostatic discharge protection chip of the present invention, the detection element is a light emitting diode (LED), a negative electrode of the LED is connected between the equivalent resistor and the first resistor, and a positive electrode of the LED is connected between the reference resistor and the second resistor.

In the driving circuit of the present invention, the first resistor is equal to said second resistor.

In the driving circuit of the present invention, the reference resistor is a variable resistor. The present invention determines whether the electrostatic discharge module is abnormal by adding the detection modules which can detect whether the electrostatic discharge module is abnormal and via the detection module by detecting the equivalent resistor of the electrostatic discharge module in the driving circuit. The present invention can reduce production costs and improve production efficiency.

DETAILED DESCRIPTION OF THE PREFERRED EMBODIMENTS

The following description of the embodiments, with reference to the accompanying drawings, is used to illustrate particular embodiments of the present invention. The direction terms referred in the present invention, such as "upper", "lower", "front", "after", "left", "right", "inner", "outer", "side surface", etc. are only the directions with regard to the accompanying drawings. Therefore, the directional terms used for describing and illustrating the present invention are not intended to limit the present invention. In the drawings, units with similar structures are indicated by the same reference number.

Figure 3:
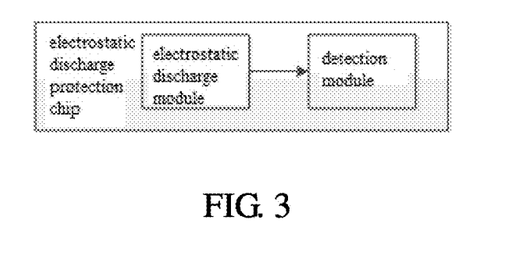
FIG. 3 is a schematic diagram of a connection structure of an electrostatic discharge protection chip in accordance with the present invention.

FIG. 3 is a schematic structural diagram of the electrostatic discharge protection chip in accordance with the present invention;

As shown in FIG. 3, the electrostatic discharge protection chip in the present invention includes an electrostatic discharge module. The electrostatic discharge module is an electrostatic discharge protection chip in the prior art. The electrostatic discharge protection chip in the present invention also includes a detection module used for detecting an equivalent resistor of the electrostatic discharge module in the driving circuit to determine whether the electrostatic discharge module is abnormal. The plurality of detection modules can be set based on the pins in the electrostatic discharge module. For example, in conjunction with FIG. 1, the detection module comprises two detection ends. A detection end of the detection module is connected with a ground pin 2 in the electrostatic discharge module, and the other detection end of the detection module is connected with a pin 3 in the electrostatic discharge module. An equivalent resistor R3 is formed between the pin 3 and the ground pin 2 in the electrostatic discharge module.

Figure 4:
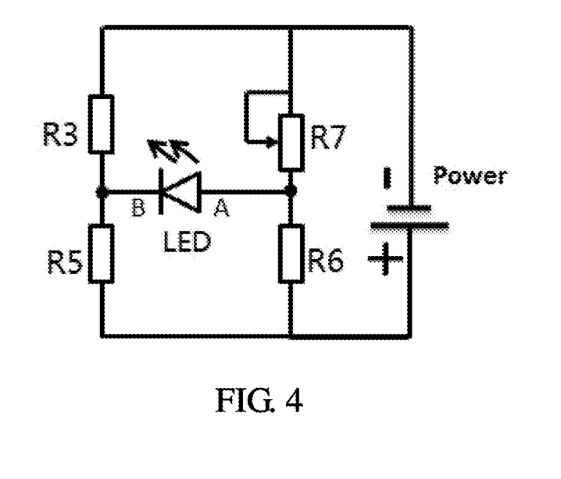
FIG. 4 is a schematic diagram of a connection structure of an electrostatic discharge protection chip in accordance with a first embodiment of the present invention.

Specifically, as shown in FIG. 4, the detection module includes a DC power source, a first resistor R5, a second resistor R6, a reference resistor R7, and a detection element;

An end of the first resistor R5 is connected with a positive electrode of the DC power source, the other end thereof is connected with an end of the equivalent resistor R3, the other end of the equivalent resistor R3 is connected with a negative electrode of the DC power source.

An end of the second resistor R6 is connected with the positive electrode of the DC power source, the other end of the second resistor R6 is connected with the reference resistor R7 in series, and then connected with the cathode negative electrode of the DC power source.

An end of the detection element, such as a light emitting diode (LED), is connected between the equivalent resistor R3 and the first resistor R5, the other end of the detection element is connected between the reference resistor R7 and the second resistor R6, and the detection element determines whether the equivalent resistor R3 is abnormal (worn off) by detecting a voltage difference between the equivalent resistor R3 and the reference resistor R7, wherein a ratio of the first resistor R5 to the equivalent resistor R3 is equal to a ratio of the second resistor R6 to the reference resistor R7.

For example, the detection element is a light emitting diode (LED). A negative electrode of the LED is connected between the equivalent resistor R3 and the first resistor R5, and a positive electrode of the LED is connected between the reference resistor R7 and the second resistor R6. The voltage of the LED negative electrode is equal to the voltage of the equivalent resistor R3, the voltage of the LED positive electrode is equal to the voltage of the reference resistor R7, since the ratio of the first resistor R5 to the equivalent resistor R3 is equal to the ratio of the second resistor R6 to the reference resistor R7, and the voltage of the LED negative electrode is equal to the voltage of the LED positive electrode. Therefore, when the electrostatic discharge module is not worn off, the resistance of the equivalent resistor R3 is unchanged, the voltage of the LED negative electrode is constant, there is no voltage difference between the positive electrode and the negative electrode of the LED, and the LED does not emit light. When the electrostatic discharge module is worn off, the resistance of the equivalent resistor R3 is reduced, the voltage of the LED negative electrode is reduced, there is a voltage difference between the positive electrode and the negative electrode of the LED, and the LED emits light.

The plurality of detection modules can be set based on the number of the pins in the electrostatic discharge module. For example, when the number of the detection modules is two, one of the detection modules is connected with the equivalent resistor R3, as shown in FIG. 4, which will be not described in detail here, since it is described above. The other one of the detection modules is as shown in FIG. 5.

For example, in conjunction with FIG. 1, the detection module comprises two detection ends. One detection end of the detection module is connected with a ground pin 2 of the electrostatic discharge module, and the other detection end of the detection module is connected with a pin 4 of the electrostatic discharge module. An equivalent resistor R4 is formed between the pin 4 and the ground pin 2 in the electrostatic discharge module.

Figure 5:
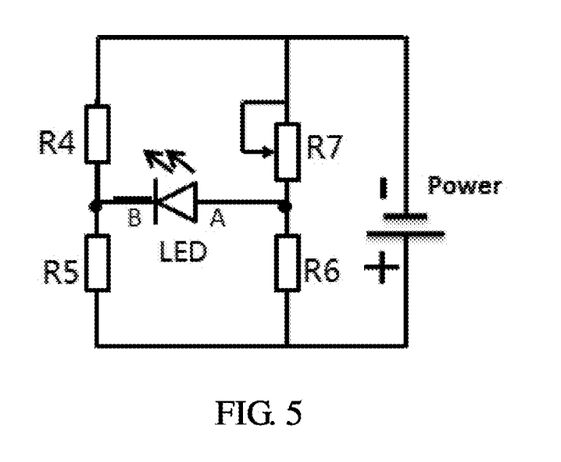
FIG. 5 is a schematic diagram of a connection structure of an electrostatic discharge protection chip in accordance with a second embodiment of the present invention.

As shown in FIG. 5, the detection module includes a DC power source, a first resistor R5, a second resistor R6, a reference resistor R7, and a detection element;

An end of the first resistor R5 is connected with a positive electrode of the DC power source, the other end thereof is connected with an end of the equivalent resistor R4, and the other end of the equivalent resistor R4 is connected with a negative electrode of the DC power source.

An end of the second resistor R6 is connected with the positive electrode of the DC power source, the other end of the second resistor R6 is connected with the reference resistor R7 in series, and then connected with the negative electrode of the DC power source.

An end of the detection element, such as a light emitting diode (LED), is connected between the equivalent resistor R4 and the first resistor R5, the other end of the detection element is connected between the reference resistor R7 and the second resistor R6, the detection element determines whether the equivalent resistor R4 is abnormal (worn off) by detecting a voltage difference between the equivalent resistor R4 and the reference resistor R7, wherein a ratio of the first resistor R5 to the equivalent resistor R4 is equal to a ratio of the second resistor R6 to the reference resistor R7.

For example, the detection element is a light emitting diode (LED). A negative electrode of the LED is connected between the equivalent resistor R4 and the first resistor R5, and a positive electrode of the LED is connected between the reference resistor R7 and the second resistor R6. The voltage of the LED negative electrode is equal to the voltage of the equivalent resistor R4, the voltage of the LED positive electrode is equal to the voltage of the reference resistor R7, since the ratio of the first resistor R5 to the equivalent resistor R4 is equal to the ratio of the second resistor R6 to the reference resistor R7, and the voltage of the LED negative electrode is equal to the voltage of the LED positive electrode. Therefore, when the electrostatic discharge module is not worn off, the resistance of the equivalent resistor R4 is unchanged, the voltage of the LED negative electrode is constant, there is no voltage difference between the positive electrode and the negative electrode of the LED, and the LED does not emit light. When the electrostatic discharge module is worn off, the resistance of the equivalent resistor R4 is reduced, the voltage of the LED negative electrode is reduced, there is a voltage difference between the positive electrode and the negative electrode of the LED, and the LED emits light.

Preferably, the resistance of the reference resistor R7 can be set equal to the resistance of the equivalent resistor R4 when the electrostatic discharge module is not worn off. The resistance of the first resistor R5 is equal to the resistance of the second resistor R6. The reference resistor is a variable resistor.

The present invention determines whether the electrostatic discharge module is abnormal by adding the detection modules which can detect whether the electrostatic discharge module is abnormal and via the detection module by detecting the equivalent resistor of the electrostatic discharge module in the driving circuit. The present invention can reduce production costs and improve production efficiency.

Figure 6:
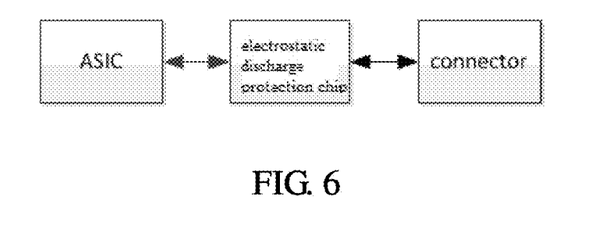
FIG. 6 is a schematic diagram of a connection structure of a driving circuit in accordance with the present invention.

FIG. 6 is a schematic diagram of a connection structure of a driving circuit in accordance with the present invention.

As shown in FIG. 6, the present invention also provides a driving circuit. The driving circuit is disposed in a liquid crystal display device for driving a liquid crystal display panel. The driving circuit includes a driving chip (ASIC) and a connector connected with the liquid crystal display panel. The driving circuit further includes an electrostatic discharge protection chip, which is respectively connected with the driving chip and the connector. The electrostatic discharge protection chip includes an electrostatic discharge module. The electrostatic discharge module is an electrostatic discharge protection chip in the prior art. The electrostatic discharge protection chip in the present invention also includes at least a detection module used for detecting an equivalent resistor of the electrostatic discharge module in the driving circuit to determine whether the electrostatic discharge module is abnormal (worn off).

Figure 7:
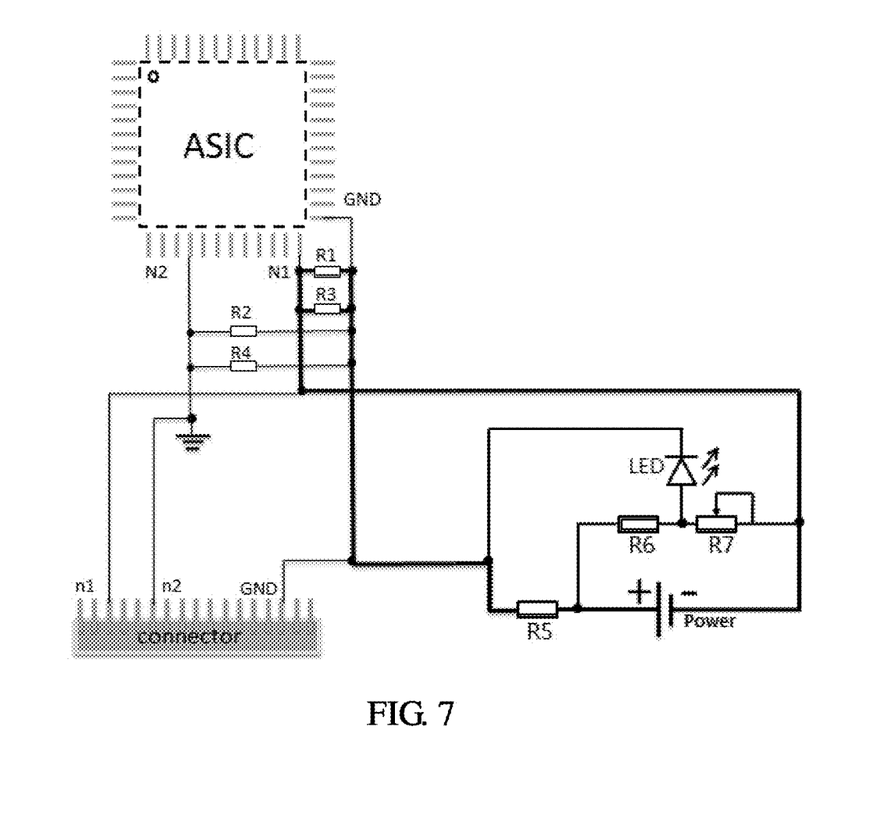
FIG. 7 is a schematic diagram of a connection structure of a driving circuit in accordance with a first embodiment of the present invention.

As shown in FIG. 7, the driving chip (ASIC) is connected with the connector. There is a ground resistor R1 between a pin N1 of the driving chip and the pin n1 of the connector. The electrostatic discharge protection chip includes two detection ends. A detection end of the electrostatic discharge protection chip is connected between the pin N1 of the driving chip and the pin n1 of the connector. The other detection end of the electrostatic discharge protection chip is connected between a ground pin (GND) of the driving chip and a ground pin (GND) of the connector.

The detection module includes a DC power source, a first resistor R5, a second resistor R6, a reference resistor R7, and a detection element.

The positive electrode of the DC power source, an integral resistor constituted by the first resistor R5, the ground resistor R1 and the equivalent resistor R3, and the negative electrode of the DC power source forms a first loop (as shown by the bold portions in FIG. 7).

An end of the first resistor R5 is connected with the positive electrode of the DC power source, and the other end is connected with an end of a first to-be-tested resistor (the equivalent resistor R3 of the electrostatic discharge module and the ground resistor R1 are connected in parallel to form the first to-be-tested resistor). The other end of the first to-be-tested resistor is connected with the negative electrode of the DC power source. An end of the second resistor R6 is connected with the positive electrode of the DC power source, and the other end of the second resistor R6 is connected with the reference resistor R7 in series, and then connected with the negative electrode of the DC power source.

An end of the detection element, such as a light emitting diode (LED), is connected between the first to-be-tested resistor and the first resistor R5, the other end of the detection element is connected between the reference resistor R7 and the second resistor R6, the detection element determines whether the first to-be-tested resistor is abnormal (worn off) by detecting a voltage difference between the first to-be-tested resistor and the reference resistor R7, which is the voltage difference between the two ends of the detection element, wherein a ratio of the resistance of the first resistor R5 to the resistance of the first to-be-tested resistor is equal to a ratio of the resistance of the second resistor R6 to the resistance of the reference resistor R7.

The resistance of the first to-be-tested resistor is equal to the resistance of the equivalent resistor R3 connected with the ground resistor R1 in parallel. Under normal circumstances, the resistance of the ground resistor R1 is constant, and therefore the resistance of the first to-be-tested resistor is proportional to the resistance of the equivalent resistor R3. The change of the equivalent resistor R3 is determined by detecting the change in the resistance of the first to-be-tested resistor, thereby determining whether the electrostatic discharge module is abnormal (worn off).

For example, the detection element is a light emitting diode (LED). A negative electrode of the LED is connected between the first to-be-tested resistor and the first resistor R5, and a positive electrode of the LED is connected between the reference resistor R7 and the second resistor R6. The voltage of the LED negative electrode is equal to the voltage of the first to-be-tested resistor, the voltage of the LED positive electrode is equal to the voltage of the reference resistor R7, since the ratio of the resistance of the first resistor R5 to the resistance of the first to-be-tested resistor is equal to the ratio of the resistance of the second resistor R6 to the resistance of the reference resistor R7, and the voltage of the LED negative electrode is equal to the voltage of the LED positive electrode. Therefore, when the electrostatic discharge module is not worn off, the equivalent resistor R3 is unchanged, the first to-be-tested resistor is unchanged, the voltage of the LED negative electrode is constant, there is no voltage difference between the positive electrode and the negative electrode of the LED, and the LED does not emit light. When the electrostatic discharge module is worn off, the resistance of the equivalent resistor R3 is reduced, the resistance of the first to-be-tested resistor is reduced, the voltage of the LED negative electrode is reduced, there is a voltage difference between the positive electrode and the negative electrode of the LED, and the LED emits light.

Preferably, the resistance of the reference resistor R7 can be set equal to the resistance of the first to-be-tested resistor when the electrostatic discharge module is not worn off. The resistance of the first resistor R5 is equal to the resistance of the second resistor R6. The reference resistor R7 is a variable resistor.

The plurality of detection modules can be set based on the number of the pins in the electrostatic discharge module. For example, when the number of the detection modules is two, one of the detection modules is connected with the equivalent resistor R3, as shown in FIG. 7, which will be not described in detail here, since it is described above. The other one of the detection modules is as shown in FIG. 8.

Figure 8:
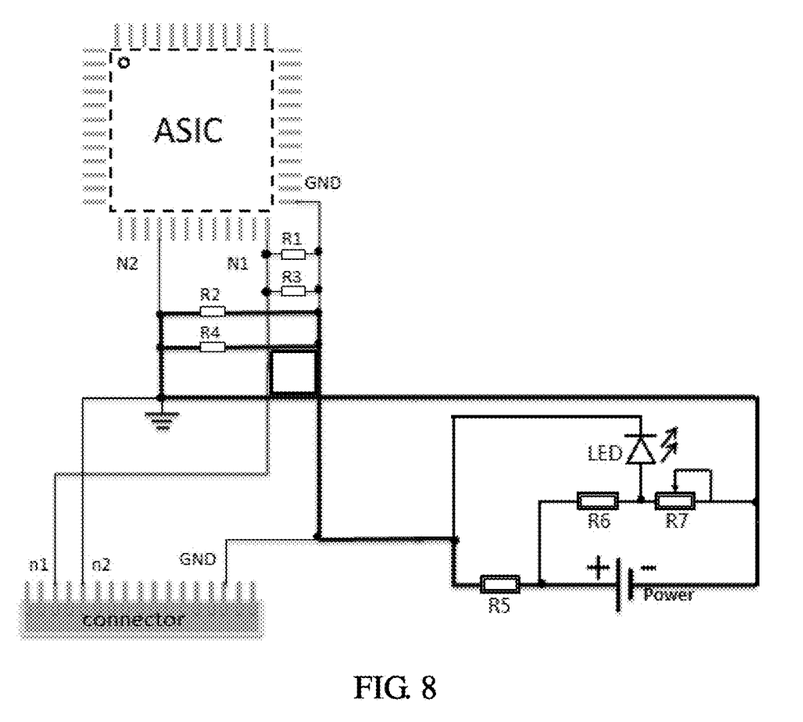
FIG. 8 is a schematic diagram of a connection structure of a driving circuit in accordance with a second embodiment of the present invention.

As shown in FIG. 8, the driving chip (ASIC) is connected with the connector. There is a ground resistor R2 between a pin N2 of the driving chip and the pin n2 of the connector. The electrostatic discharge protection chip includes two detection ends. A detection end of the electrostatic discharge protection chip is connected between the pin N1 of the driving chip and the pin n1 of the connector. The other detection end of the electrostatic discharge protection chip is connected between a ground pin (GND) of the driving chip and a ground pin (GND) of the connector.

The detection module includes a DC power source, a first resistor R5, a second resistor R6, a reference resistor R7, and a detection element.

The positive electrode of the DC power source, an integral resistor constituted by the first resistor R5, the ground resistor R2 and the equivalent resistor R4, and the negative electrode of the DC power source forms a second loop (as shown by the bold portions in FIG. 8). An end of the first resistor R5 is connected with the positive electrode of the DC power source, and the other end is connected with an end of a second to-be-tested resistor (the equivalent resistor R4 of the electrostatic discharge module and the ground resistor R2 are connected in parallel to form the second to-be-tested resistor). The other end of the second to-be-tested resistor is connected with the negative electrode of the DC power source.

An end of the second resistor R6 is connected with the positive electrode of the DC power source, and the other end of the second resistor R6 is connected with the reference resistor R7 in series, and then connected with the negative electrode of the DC power source.

An end of the detection element, such as a light emitting diode (LED), is connected between the second to-be-tested resistor and the first resistor R5, the other end of the detection element is connected between the reference resistor R7 and the second resistor R6, the detection element determines whether the equivalent resistor is abnormal (worn off) by detecting a voltage difference between the reference resistor R7 and the second to-be-tested resistor, which is the voltage difference between the two ends of the detection element, wherein a ratio of the resistance of the first resistor R5 to the resistance of the second to-be-tested resistor is equal to a ratio of the resistance of the second resistor R6 to the resistance of the reference resistor R7.

The resistance of the second to-be-tested resistor is equal to the resistance of the equivalent resistor R4 connected with the ground resistor R2 in parallel. Under normal circumstances, the resistance of the ground resistor R2 is constant, and therefore the resistance of the second to-be-tested resistor is proportional to the resistance of the equivalent resistor R4. The change of the equivalent resistor R4 is determined by detecting the change in the resistance of the second to-be-tested resistor, thereby determining whether the electrostatic discharge module is abnormal (worn off).

For example, the detection element is a light emitting diode (LED). A negative electrode of the LED is connected between the second to-be-tested resistor and the first resistor R5, and a positive electrode of the LED is connected between the reference resistor R7 and the second resistor R6. The voltage of the LED negative electrode is equal to the voltage of the second to-be-tested resistor, the voltage of the LED positive electrode is equal to the voltage of the reference resistor R7, since the ratio of the resistance of the first resistor R5 to the resistance of the second to-be-tested resistor is equal to the ratio of the resistance of the second resistor R6 to the resistance of the reference resistor R7, and the voltage of the LED negative electrode is equal to the voltage of the LED positive electrode. Therefore, when the electrostatic discharge module is not worn off, the equivalent resistor R4 is unchanged, the second to-be-tested resistor is unchanged, the voltage of the LED negative electrode is constant, there is no voltage difference between the positive electrode and the negative electrode of the LED, and the LED does not emit light. When the electrostatic discharge module is worn off, the resistance of the equivalent resistor R3 is reduced, the resistance of the second to-be-tested resistor is reduced, the voltage of the LED negative electrode is reduced, there is a voltage difference between the positive electrode and the negative electrode of the LED, and the LED emits light.

Preferably, the resistance of the reference resistor R7 can be set equal to the resistance of the second to-be-tested resistor when the electrostatic discharge module is not worn off. The resistance of the first resistor R5 is equal to the resistance of the second resistor R6. The reference resistor R7 is a variable resistor. Since the electrostatic discharge module is described above, it will be not described in detail here.

The present invention determines whether the electrostatic discharge module is abnormal by adding the detection modules which can detect whether the electrostatic discharge module is abnormal, and via the detection module by detecting the equivalent resistor of the electrostatic discharge module in the driving circuit. The present invention can reduce production costs and improve production efficiency.

In summary, although the present invention has been described above for disclosing a preferred embodiment, the foregoing preferred embodiments in the present invention are not intended to limit the present invention. A person of ordinary skill in the art, without departing from the spirit and scope of the invention otherwise, may make modifications and variations, so the protection scopes of the invention are defined in the claims.

What is claimed is:

1. An electrostatic discharge protection chip disposed in a liquid crystal display device, the liquid crystal display device including a liquid crystal display panel and a driving circuit for driving the liquid crystal display panel, the driving circuit including a driving chip and a connector connected with the liquid crystal display panel, the electrostatic discharge protection chip comprising:
    an electrostatic discharge module for discharging abnormal static electricity on the driver chip; and
    at least one detection module for detecting an equivalent resistance value of the electrostatic discharge module in the driving circuit to determine whether the electrostatic discharge module is abnormal;
    the electrostatic discharge protection chip being connected with the driving chip and the connector, respectively,
    wherein the detection module comprises a DC power source, a first resistor, a second resistor, a reference resistor, and a detection element,
    the first resistor is connected between a positive electrode of the DC power source and a first end of an equivalent resistor, the equivalent resistor between an end of the first resistor and a positive electrode of the DC power source;
    a first end of the second resistor is connected with the positive electrode of the DC power source, a second end of the second resistor is connected with the reference resistor in series, and then connected with the negative electrode of the DC power source,
    a first end of the detection element is connected between the equivalent resistor and the first resistor, a second end of the detection element is connected between the reference resistor and the second resistor, and the detection element determines whether the equivalent resistor is abnormal by detecting a voltage difference between the equivalent resistor and the reference resistor, wherein a ratio of the first resistor to the equivalent resistor is equal to a ratio of the second resistor to the reference resistor,
    wherein the first resistor is equal to the second resistor,
    wherein the reference resistor is a variable resistor.

2. The electrostatic discharge protection chip as claimed in claim 1, wherein the detection element is a light emitting diode (LED), a negative electrode of the LED is connected between the equivalent resistor and the first resistor, and a positive electrode of the LED is connected between the reference resistor and the second resistor.

3. The electrostatic discharge protection chip as claimed in claim 2, wherein when the LED emits light, the equivalent resistor is abnormal, and when the LED does not emit light, the equivalent resistor is normal.

4. An electrostatic discharge protection chip disposed in a liquid crystal display device, the liquid crystal display device including a liquid crystal display panel and a driving circuit for driving the liquid crystal display panel, the driving circuit including a driving chip and a connector connected with the liquid crystal display panel, the electrostatic discharge protection chip comprising:
   an electrostatic discharge module for discharging abnormal static electricity on the driver chip; and
   at least one detection module for detecting an equivalent resistance value of the electrostatic discharge module in the driving circuit to determine whether the electrostatic discharge module is abnormal;
   the electrostatic discharge protection chip being connected with the driving chip and the connector, respectively,
   wherein the detection module comprises a DC power source, a first resistor, a second resistor, a reference resistor, and a detection element,
   the first resistor is connected between a positive electrode of the DC power source and a first end of a equivalent resistor formed between an end of the first resistor and a negative electrode of the DC power source;
   a first end of the second resistor is connected with the positive electrode of the DC power source, a second end of the second resistor is connected with the reference resistor in series, and then connected with the negative electrode of the DC power source,
   a first end of the detection element is connected between the equivalent resistor and the first resistor, a second end of the detection element is connected between the reference resistor and the second resistor, and the detection element determines whether the equivalent resistor is abnormal by detecting a voltage difference between the equivalent resistor and the reference resistor, wherein a ratio of the first resistor to the equivalent resistor is equal to a ratio of the second resistor to the reference resistor.

5. The electrostatic discharge protection chip as claimed in claim 4, wherein the first resistor is equal to the second resistor.

6. The electrostatic discharge protection chip as claimed in claim 4, wherein the reference resistor is a variable resistor.

7. The electrostatic discharge protection chip as claimed in claim 4, wherein the detection element is a light emitting diode (LED), a negative electrode of the LED is connected between the equivalent resistor and the first resistor, and a positive electrode of the LED is connected between the reference resistor and the second resistor, when the LED emits light, the equivalent resistor is abnormal, and when the LED does not emit light, the equivalent resistor is normal.

8. The electrostatic discharge protection chip as claimed in claim 7, wherein the first resistor is equal to the second resistor.

9. The electrostatic discharge protection chip as claimed in claim 7, wherein the reference resistor is a variable resistor.

10. A driving circuit, the driving circuit comprising a driving chip and a connector connected with the liquid crystal display panel, wherein the driving circuit further comprises an electrostatic discharge protection chip, and the electrostatic discharge protection chip comprises:
    an electrostatic discharge module for discharging abnormal static electricity on the driver chip; and
    at least one detection module for detecting an equivalent resistance value of the electrostatic discharge module in the driving circuit to determine whether the electrostatic discharge module is abnormal;
    the electrostatic discharge protection chip being connected with the driving chip and the connector, respectively,
    wherein the detection module comprises a DC power source, a first resistor, a second resistor, a reference resistor, and a detection element,
    the first resistor is connected between a positive electrode of the DC power source and a first end of a equivalent resistor formed between an end of the first resistor and a negative electrode of the DC power source;
    a first end of the second resistor is connected with the positive electrode of the DC power source, a second end of the second resistor is connected with the reference resistor in series, and then connected with the negative electrode of the DC power source,
    a first end of the detection element is connected between the equivalent resistor and the first resistor, a second end of the detection element is connected between the reference resistor and the second resistor, and the detection element determines whether the equivalent resistor is abnormal by detecting a voltage difference between the equivalent resistor and the reference resistor, wherein a ratio of the first resistor to the equivalent resistor is equal to a ratio of the second resistor to the reference resistor.

11. The driving circuit as claimed in claim 10, wherein the first resistor is equal to the second resistor.

12. The driving circuit as claimed in claim 10, wherein the reference resistor is a variable resistor.

13. The driving circuit as claimed in claim 10, wherein the detection element is a light emitting diode (LED), a negative electrode of the LED is connected between the equivalent resistor and the first resistor, and a positive electrode of the LED is connected between the reference resistor and the second resistor, when the LED emits light, the equivalent resistor is abnormal, and when the LED does not emit light, the equivalent resistor is normal.

* * * * *